(12) United States Patent
Tomida

(10) Patent No.: US 11,066,284 B2
(45) Date of Patent: Jul. 20, 2021

(54) ARTICLE TRANSPORT VEHICLE

(71) Applicant: Daifuku Co., Ltd., Osaka (JP)

(72) Inventor: Daichi Tomida, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 408 days.

(21) Appl. No.: 16/031,231

(22) Filed: Jul. 10, 2018

(65) Prior Publication Data

US 2019/0016574 A1   Jan. 17, 2019

(30) Foreign Application Priority Data

Jul. 11, 2017   (JP) .............................. JP2017-135617

(51) Int. Cl.
  *B66F 9/07*   (2006.01)
  *B65G 1/04*   (2006.01)
  *H01L 21/677*   (2006.01)

(52) U.S. Cl.
  CPC .............. *B66F 9/07* (2013.01); *B65G 1/0457* (2013.01); *H01L 21/6773* (2013.01); *H01L 21/67733* (2013.01); *H01L 21/67736* (2013.01)

(58) Field of Classification Search
  None
  See application file for complete search history.

(56) References Cited

U.S. PATENT DOCUMENTS

| 7,210,589 | B2 * | 5/2007 | Iizuka | .................... B66C 13/06 |
| | | | | 212/270 |
| 9,312,158 | B2 * | 4/2016 | Wada | ................ H01L 21/67733 |
| 9,536,766 | B2 | 1/2017 | Kinugawa | |
| 9,576,832 | B2 * | 2/2017 | Tomida | .................... B66C 11/04 |
| 2011/0062103 | A1 * | 3/2011 | Honda | ............. H01L 21/67736 |
| | | | | 212/71 |

FOREIGN PATENT DOCUMENTS

JP   2015134659 A   7/2015

\* cited by examiner

*Primary Examiner* — Michael S Lowe
(74) *Attorney, Agent, or Firm* — The Webb Law Firm

(57) ABSTRACT

An object is to provide an article transport vehicle which includes one or more fall preventing members while reducing any increase in complexity of the arrangement. An article transport vehicle includes a travel portion, a support portion, and a moving mechanism. The moving mechanism is configured to move the support portion to a projected position and to a retracted position. The support portion includes a support member configured to support a container, a movable member configured to be moved along a lateral width direction by the moving mechanism, and a vertically moving mechanism configured to move the support member along the vertical direction with respect to the movable member. The article transport vehicle further includes one or more fall preventing members configured to prevent a lid of a supported container from falling, and a movement coupling mechanism configured to move the one or more fall preventing members when the support member is moved.

11 Claims, 7 Drawing Sheets

ARTICLE TRANSPORT VEHICLE

CROSS-REFERENCE TO RELATED APPLICATION

This application claims priority to Japanese Patent Application No. 2017-135617 filed Jul. 11, 2017, the disclosure of which is hereby incorporated in its entirety by reference.

FIELD OF THE INVENTION

The present invention relates to an article transport vehicle which comprises a moving mechanism configured to move a support portion configured to support a container along a lateral width direction which crosses the travel path as seen along a vertical direction.

BACKGROUND ART

JP Publication of Application No. 2015-134659 describes an article transport vehicle having a travel portion which travels along a travel path, a support portion which supports a container, a moving mechanism which moves the support portion along a lateral width direction which crosses the travel path as seen along a vertical direction. This article transport vehicle transports a container with the container supported by the support portion. And when transferring a container between the support portion and a transfer target location displaced from the travel path along the lateral width direction, the container is transferred by moving the support portion along the lateral width direction by means of the moving mechanism and by vertically moving the support member with respect to the travel portion by means of a raising-and-lowering mechanism of the support portion, with the travel portion at rest at a location that corresponds to the transfer target location.

Although the opening of the container transported by the article transport vehicle is closed by a lid, the lid may become detached from a main body portion of the container if the lid is not properly fixed to the main body portion. And when the lid of the container becomes detached while the article transport vehicle is transporting a container, the lid may fall from the article transport vehicle.

To address this issue, it is conceivable to provide a fall preventing member located on the opposite side of the lid (of the container supported by the support portion) from the main body portion of the container so that the fall preventing member can contact the lid in the event that it becomes detached from the main body portion and prevent the lid from falling from the article transport vehicle. And when a fall preventing member is provided as described above, it is also conceivable to provide an actuator for moving the fall preventing member so that the fall preventing member can be retracted in order to prevent the fall preventing member from coming into contact with a container placed at a transfer target location when transferring the container between the transfer target location and the support portion. However, providing such an actuator for moving the fall preventing member creates potential issues including increasing in cost and the complexity of the control. As such, providing a fall preventing member tends to make the arrangement and structure of an article transport vehicle more complex.

SUMMARY OF THE INVENTION

To address this issue, it is desirable to provide an article transport vehicle which is provided with a fall preventing member while reducing any increase in complexity in the arrangement and/or structure of the article transport vehicle.

An article transport vehicle in light of the above point comprises: a travel portion configured to travel along a travel path; a support portion configured to support a container; and a moving mechanism configured to move the support portion along a lateral width direction which crosses the travel path as seen along a vertical direction, wherein the moving mechanism is configured to move the support portion to a projected position at which the support portion is projected along the lateral width direction with respect to the travel portion, and to a retracted position at which the support portion is closer to the travel portion than at the projected position, wherein the support portion includes a support member configured to support a bottom surface of a container from below, a movable member configured to be moved along the lateral width direction by the moving mechanism, and a vertically moving mechanism configured to move the support member along the vertical direction with respect to the movable member, wherein the container includes a main body portion which has an opening which faces a direction along the lateral width direction when the container is supported by the support portion, and a lid for closing the opening, wherein the article transport vehicle further comprises one or more fall preventing members configured to prevent a lid of a supported container which is the container that is supported by the support member from falling, and a movement coupling mechanism configured to move the one or more fall preventing members when the support member is moved, wherein each of the one or more fall preventing members is located on the opposite side of the lid of the supported container from the main body portion, and is configured to be movable to a preventing position in which the fall preventing member protrudes upward with respect to a lower end of the lid, and to a retracted position in which the fall preventing member is retracted so as to be located lower than the lower end of the lid, and wherein the movement coupling mechanism is configured to move the one or more fall preventing members from respective retracted positions to respective preventing positions when the support member is raised, and to move the one or more fall preventing members from respective preventing positions to respective retracted positions when the support member is lowered.

With such an arrangement, when transferring a container from a transfer target location located to one side of the travel path to the support member with the travel portion at rest at a position that corresponds to the transfer target location, the support portion is moved from the retracted position to the projected position by the moving mechanism, then the support member of the support portion is raised with respect to the movable member by the vertically moving mechanism to place the container at the transfer target location on the support member. Subsequently, the support portion is moved from the projected position to the retracted position by the moving mechanism And the one or more fall preventing members are moved from respective retracted positions to respective restricting positions by the movement coupling mechanism when the support member is raised with respect to the movable member. Therefore, the one or more fall preventing members are in respective retracted positions when moving the support member (which is not supporting any container) from the retracted position to the projected position. This makes it unlikely for the one or more fall preventing members to come into contact with the container located at the transfer target location. And when moving the support portion which now supports the container from the projected position to the retracted position, the one or more fall preventing members can prevent the lid of the container that may have become detached from the main body portion from falling off from the article transport vehicle.

In addition, when transferring a container from the support member to a transfer target location with the travel portion at rest at a position that corresponds to a transfer target location, the support portion is moved from the retracted position to the projected position by the moving mechanism, then the support member of the support portion is lowered with respect to the movable member by the vertically moving mechanism to unload the container (on the support member) to the transfer target location. Subsequently, the support portion is moved from the projected position to the retracted position by the moving mechanism. And the one or more fall preventing members are moved from respective restricting positions to respective retracted positions by the movement coupling mechanism when the support member is lowered with respect to the movable member. Therefore, when moving the support portion which supports the container from the retracted position to the projected position, the one or more fall preventing members can prevent the lid of the container that may have become detached from the main body portion from falling off from the article transport vehicle. And, the one or more fall preventing members are in respective retracted positions when moving the support member which is not supporting any container from the projected position to the retracted position. This makes it unlikely for the one or more fall preventing members to come into contact with the container located at the transfer target location.

And the one or more fall preventing members are moved to respective restricting positions and to respective retracted positions by the movement coupling mechanism when the support member is raised and lowered. Thus, it is not necessary to provide an actuator exclusively for moving the one or more fall preventing members to respective restricting positions and to respective retracted positions. In addition, this arrangement makes it unnecessary to control such an actuator to operate when the support member is vertically moved. Therefore, the above arrangement makes it possible to prevent a lid from falling off from an article transport vehicle by providing one or more fall preventing members while making it possible to simplify the structure and/or an arrangement of an article transport vehicle compared with a case where an actuator is provided exclusively for moving such one or more fall preventing members.

DETAILED DESCRIPTION OF EMBODIMENTS

Figure 1:
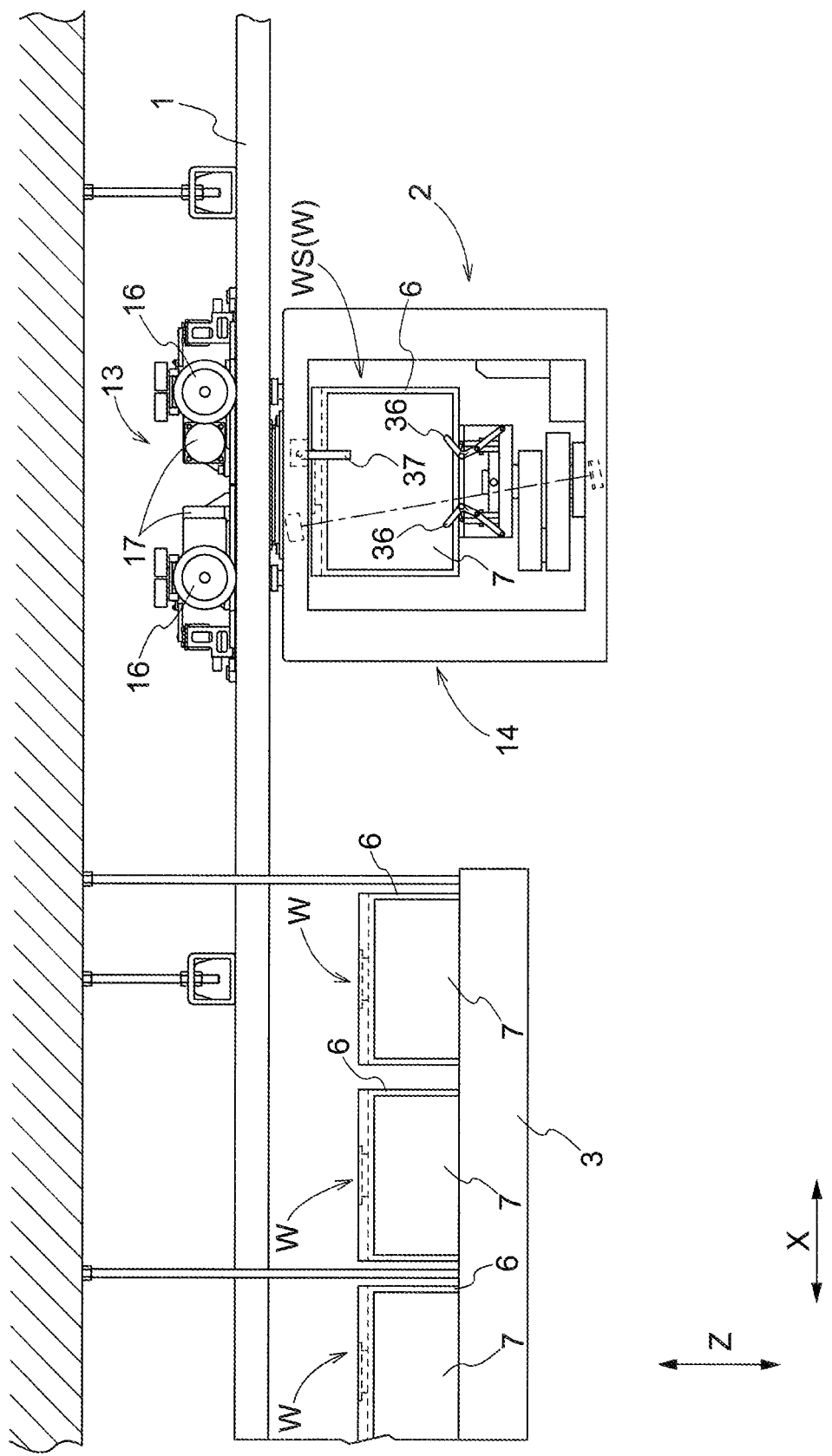
FIG. 1 is a side view of an article transport facility.
Figure 2:
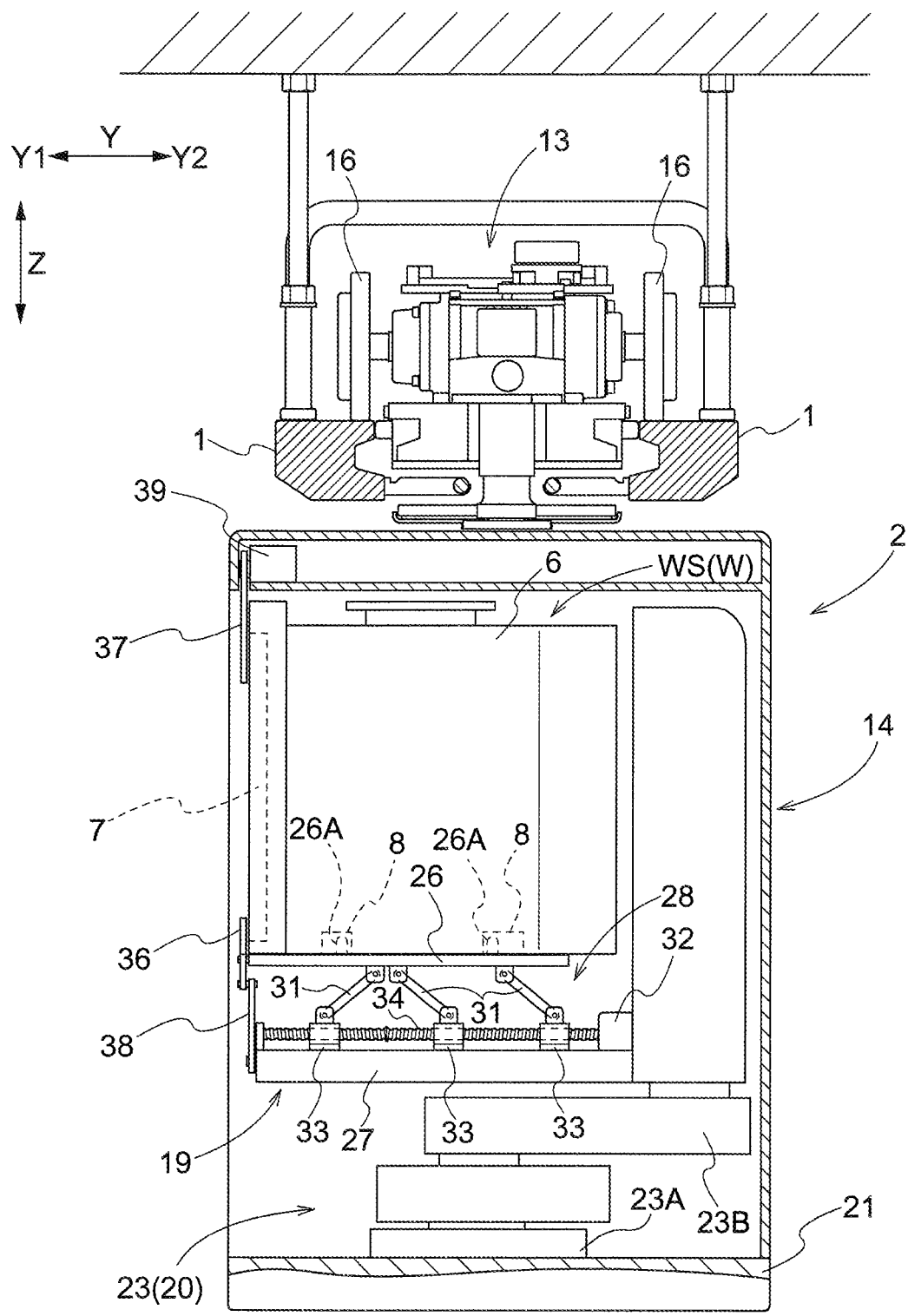
FIG. 2 is a vertical partially sectional rear view of an article transport vehicle.

Embodiments of an article transport facility having an article transport vehicles are described next with reference to attached drawings. As shown in FIGS. 1 and 2, the article transport facility includes travel rails 1 provided to extend along a travel path and on the ceiling side (i.e., provided closer to the ceiling than the floor), an article transport vehicle 2 configured to be supported by the travel rails 1 and to travel along the travel path, and a storage rack 3 which is located to a lateral side of (i.e., so located to be displaced along the lateral direction, as seen along a vertical direction, with respect to) the travel path for storing one or more containers W. The article transport vehicle 2 is configured to transport containers W, one container W at a time, from other locations to the storage rack 3 and to transport containers W stored on the storage rack 3, one container at a time, to other locations. Note that, in the following description, a horizontal direction parallel to the travel path will be referred to the "front-and-back direction X" whereas a horizontal direction perpendicular to the front-and-back direction X as seen along a vertical direction Z will be referred to the "lateral width direction Y". In addition, one direction along (i.e. parallel to) the lateral width direction will be referred to the "first-side direction Y1 along the lateral width direction Y" (or simply "first side Y1 along the lateral width direction Y" when referring to a side with respect to something) while the other direction (opposite from the first direction Y1) along the lateral width direction Y will be referred to as the "second-side direction Y2 along the lateral width direction Y" (or simply "second side Y2 along the lateral width direction Y" when appropriate).

[Container]

As shown in FIGS. 5 through 8, each container W is transported by the article transport vehicle 2 in an orientation in which the front side of the container W is oriented in the first-side direction Y1 (or faces the first-side Y1) along the lateral width direction Y, and can be then stored in the storage rack 3. Accordingly, when describing a container W from this point forward, the "front-and-back direction for the container W" is assumed to be parallel to the lateral width direction Y described above and the front side of the container is assumed to coincide with the first-side Y1 along the lateral width direction Y, based on the orientation of the container W when it is being transporting by the article transport vehicle 2 (i.e., when it is being supported by the support portion 19 described below)

Figure 3:
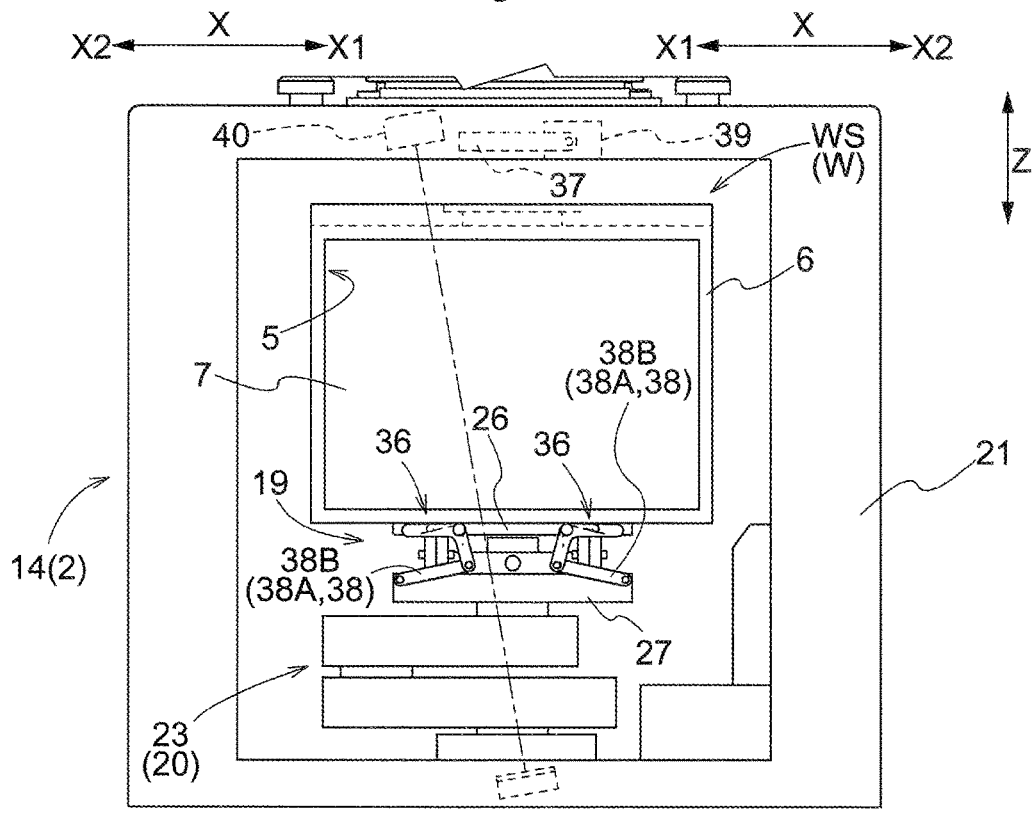
FIG. 3 is a side view of the article transport vehicle with its support member at a raised height.
Figure 4:
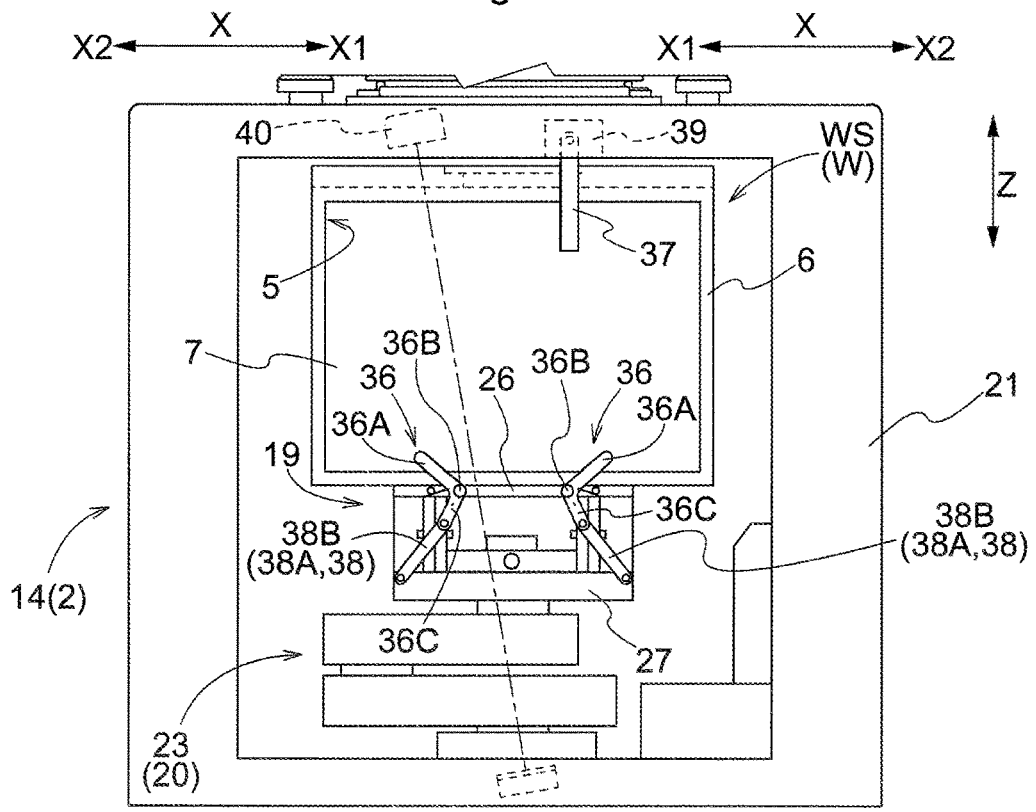
FIG. 4 is a side view of the article transport vehicle with its support member at a lowered height.

As shown in FIGS. 2 through 4, each container W has a main body portion 6 which opens in (i.e., its opening 5 faces) the first-side direction Y1 along the lateral width direction Y, and a lid 7 for closing the opening 5. A space for holding a plurality of substrates is formed in the main body portion 6 and the substrates are inserted into, and retrieved from, the main body portion through the opening 5. In addition, as shown in FIG. 2, recessed portions 8 are formed in the bottom surface of the main body portion 6 (bottom surface of the container W) such that each recessed portion 8 is recessed upward (i.e., opens downward). There are a total of three recessed portions 8 provided to the bottom surface with two front-side recessed portions 8 displaced in the first-side direction Y1 along the lateral width direction Y with respect to a center of the main body portion 6 along the lateral width direction Y and one back-side recessed portion 8 displaced in the second-side direction Y2 along the lateral width direction Y with respect to the center. One of the two front-side recessed portion 8 is located in one end area, along the front-and-back direction X, of the bottom surface of the main body portion 6 and the other located in the other end area along the front-and-back direction X whereas the back-side recessed portion 8 is located in an central area, along the front-and-back direction X, of the bottom surface of the main body portion 6.

[Storage Rack]

As shown in FIG. 1 as well as FIGS. 5 through 8, a storage rack 3 consisting of storage rack portions is provided to be located to the first side Y1 along the lateral width direction Y of the travel path along which the article transport vehicle 2 travels such that the storage rack portions (portions of the storage rack 3) are located one next to another along the travel path. The storage rack 3 is located at the same height as the article transport vehicle 2 traveling along the travel path. Each of the storage rack portions of the storage rack 3 has a storage support member 10 for supporting the bottom surface of one container W from below. Each storage support member 10 is configured to support both end portions, along the front-and-back direction X, of the bottom surface of a container W. In addition, each storage support member 10 has two storage projections (or kinematic pins) 11 configured to engage corresponding front-side recessed portions 8 of the container W with one storage projection spaced apart from the other along the front-and-back direction X. By supporting the container W with the two storage projections 11 in engagement with corresponding front-side recessed portions 8 of the container W, each storage support member 10 is configured to be capable of supporting a container W with the container properly located at a predetermined storage position on the storage support member 10.

[Article Transport Vehicle]

As shown in FIG. 2, the article transport vehicle 2 has a travel portion 13 configured to travel along a travel path and on the travel rails 1 which are supported by the ceiling, and a support main body 14 located below the travel rails 1, and suspended and supported by the travel portion 13. The travel portion 13 has driven wheels 16 which roll on the top surfaces of the travel rails 1, and drive motors 17 (electric motors for rotating or driving the wheels 16) which drivingly rotate the driven wheels 16. And the travel portion 13 travels along the travel rails 1 as a result of the driven wheels 16 being rotated by the respective drive motors 17.

The support main body 14 has a support portion 19 configured to support a container W, a moving mechanism 20 configured to move the support portion 19 along (i.e., parallel to) the lateral width direction Y, and a cover member 21. As shown in FIGS. 3 and 4, the cover member 21 is formed to have a shape of a rectangular frame (as seen along the lateral width direction Y) that covers, or extends across, areas on both sides along the vertical direction Z of (i.e., areas above and below) the supported container WS as well as areas on both sides along the front-and-back direction X (i.e., areas forward and rearward) of the supported container WS. In addition, the cover member 21 supports the moving mechanism 20 and is supported by the travel portion 13, and is, or corresponds to, the intermediate portion in the present embodiment.

The moving mechanism 20 includes a first linkage mechanism 23 which can be extended and retracted along the lateral width direction Y, and an extending and retracting motor 24 (an electric motor; see FIG. 9) used to extend and retract the first linkage mechanism 23. A proximal end portion 23A of the first linkage mechanism 23 is connected to the cover member 21. And the support portion 19 is connected to a distal end portion 23B of the first linkage mechanism 23 such that the support portion 19 can be rotated relative to the distal end portion 23B about a vertical axis. The distal end portion 23B is a portion of a first arm of the first linkage mechanism 23, which first arm is connected to a second arm located immediately below such that the first arm can be rotated relative to the second arm about a vertical axis. The second arm is connected to the proximal end portion 23A such that the second arm can be rotated relative to the proximal end portion 23A. The power from the extending and retracting motor 24 is transmitted, and movements of the first and second arms are synchronized, through a use of gears, and/or chains and/or the like, so that the rotational motion created by the extending and retracting motor 24 is converted to a linear movement of the support portion 19. The proximal end portion 23A may house the extending and retracting motor 24. However, the first linkage mechanism 23 may be of any one of various conventional mechanisms that make use of a power of a motor and convert the power into a movement of the support portion 19. And as a result of the first linkage mechanism 23 being extended and retracted along the lateral width direction Y by the actuating power of the extending and retracting motor 24, the support portion 19 is moved by the moving mechanism 20 to a projected position (see FIGS. 6 and 7) at which the support portion 19 is projected (i.e. in a projected state) in the first-side direction Y1 along the lateral width direction Y with respect to the travel portion 13, and to a retracted position (see FIGS. 5 and 8) at which the support portion 19 is retracted (i.e., in a retracted state) in the second-side direction Y2 along the lateral width direction Y with respect to the projected position. Incidentally, when the support portion 19 is in the retracted position, the entire supported container WS is located within the cover member 21, whereas, when the support portion 19 is in the projected position, the entire supported container WS is located outside the cover member 21.

The support portion 19 has a support member 26 which is configured to support the bottom surface of a container W from below, a movable member 27 which is configured to be moved along the lateral width direction Y by the moving mechanism 20, and a vertically moving mechanism 28 which is configured to move the support member 26 along the vertical direction Z with respect to the movable member 27. The support member 26 is located above the movable member 27, and is provided with three projections 26A at three respective locations for engaging the recessed portions 8 of a container W. And the support member 26 supports a container W with the projections 26A in engagement with the recessed portions 8 of the container W and with the opening 5 of the container W (supported by the support member 26) oriented in, or facing, the first-side direction Y1 along the lateral width direction Y.

The movable member 27 is connected to the distal end portion 23B of the first linkage mechanism 23, and is moved along the lateral width direction Y as the first linkage mechanism 23 is extended and retracted. The vertically moving mechanism 28 has a plurality of first links 31 which are pivotable about respective axes that extend along the front-and-back direction X, and a vertical movement motor (an electrical motor) 32 used to change the attitude of each first link 31. Each of the plurality of first links 31 has an upper end connected to the support member 26 so as to be pivotable about an axis extending along the front-and-back direction X, and a lower end connected to a block 33 so as to be pivotable about an axis extending along the front-and-back direction X. The vertically moving mechanism 28 changes the attitudes of the plurality of first links 31 to raised attitudes (see FIGS. 2, 7, and 8) and to lowered attitudes (see FIGS. 5 and 6) by rotating a threaded shaft 34 with the actuating power of the vertical movement motor 32 to move a plurality of blocks in threading engagement with the threaded shaft 34 along the lateral width direction Y. Thus, the vertically moving mechanism 28 is configured to vertically move the support member 26 to a raised height (see FIGS. 2, 7, and 8) and to a lowered height (see FIGS. 5 and 6) by changing the attitudes of the plurality of first links 31.

As shown in FIGS. 3 and 4, the article transport vehicle 2 further includes first preventing members 36, a second preventing member 37, a movement coupling mechanism 38, a pivoting motor 39 (an electric motor used to pivot), and a detection sensor 40. The first preventing members 36 and the second preventing member 37 prevent the lid 7 of the container W supported by the support member 26 from falling. Note that each first preventing member 36 is, or corresponds to, a fall preventing member. The movement coupling mechanism 38 is configured to move the first preventing members 36 (with respect to the support member 26, thus with respect to the lower end (i.e., lower edge) of the lid 7 of any supported container WS), when the support member 26 is moved. The pivoting motor 39 causes the second preventing member 37 to be pivoted about an axis that extends along the lateral width direction Y. The first preventing members 36, the second preventing member 37, the movement coupling mechanism 38, the pivoting motor 39, and the lid detection sensor 40 are described next. Note that, when a container W is supported by the support member 26 of the article transport vehicle 2, that container is referred to as a supported container WS. In addition, each (inward) direction along the front-and-back direction X that points toward the center of the support member 26 along the front-and-back direction X will be referred to as a first-side direction X1 along the front-and-back direction X (or simply "first-side X1 along the front-and-back direction X" when referring to a side with respect to something) whereas each (outward) direction along the front-and-back direction X that points away from the center of the support member 26 along the front-and-back direction X will be referred to as a second-side direction X2 along the front-and-back direction X (or simply "second side X2 along the front-and-back direction X" when appropriate).

As shown in FIG. 2, the first preventing members 36 are located on the first-side Y1 along the lateral width direction Y of, or with respect to, the lid 7 of the supported container WS (i.e. located on the opposite side of the lid 7 from the main body portion 6). Each first preventing member 36 is configured to be movable to a preventing attitude (see FIG. 4) in which the first preventing member 36 protrudes upward with respect to the lower end of the lid 7 (i.e., at least a portion of the first preventing member 36 is located higher than the lower end of the lid 7), and to a retracted attitude (see FIG. 3) in which the first preventing member 36 is retracted downward with respect to the lower end of the lid 7 so as to be located lower than the lower end of the lid 7. As shown in FIG. 2, each first preventing member 36 is connected to an end portion, on the first-side Y1 along the lateral width direction Y, of the support member 26 so as to be pivotable about an axis extending along the lateral width direction Y. And each first preventing member 36 can be moved to the preventing attitude and to the retracted attitude as a result of being pivoted about the axis extending along the lateral width direction Y. Note that the position of the first preventing member 36 in the preventing attitude is, or corresponds to, the preventing position of the first preventing member 36 whereas the position of the first preventing member 36 in the retracted attitude is, or corresponds to, the retracted position of the first preventing member 36, in the present embodiment.

[First Preventing Member]

To describe the first preventing members 36 in more detail, each first preventing member 36 has a connected portion 36B which is pivotably connected to the support member 26, a preventing portion 36A which extends from the connected portion 36B, and a pivot arm portion 36C. The connected portion 36B, the preventing portion 36A, and the pivot arm portion 36C are integrally formed into a single piece such that each first preventing member 36 is generally formed in a shape of an "L" as seen along the lateral width direction. One first preventing member 36 is located on each side, along the front-and-back direction X, of the center of the support member 26 along the front-and-back direction X so that the article transport vehicle 2 is provided with a pair of first preventing members 36.

Figure 10:
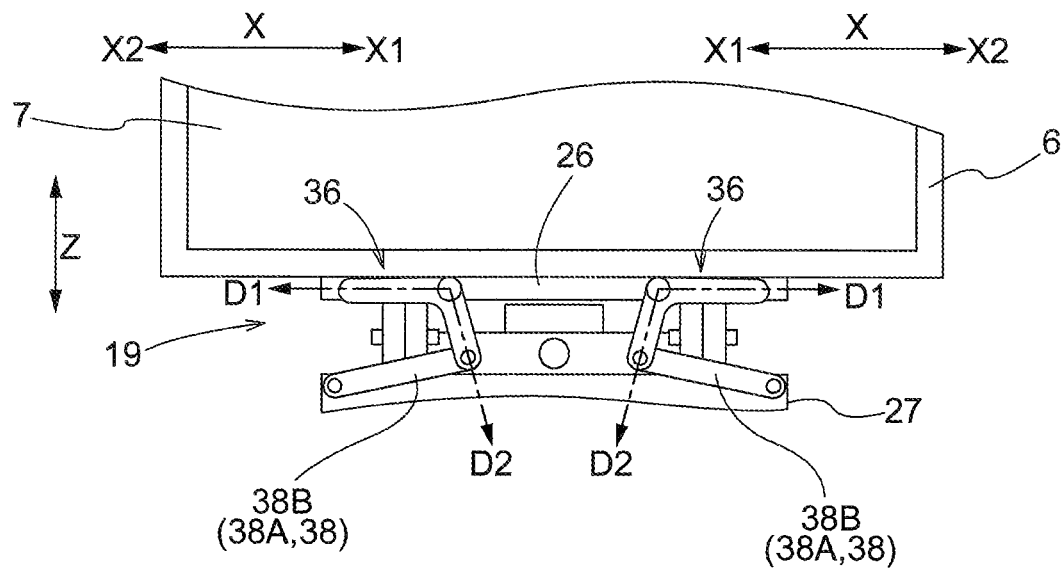
FIG. 10 is a partial enlarged view of FIG. 3.
Figure 11:
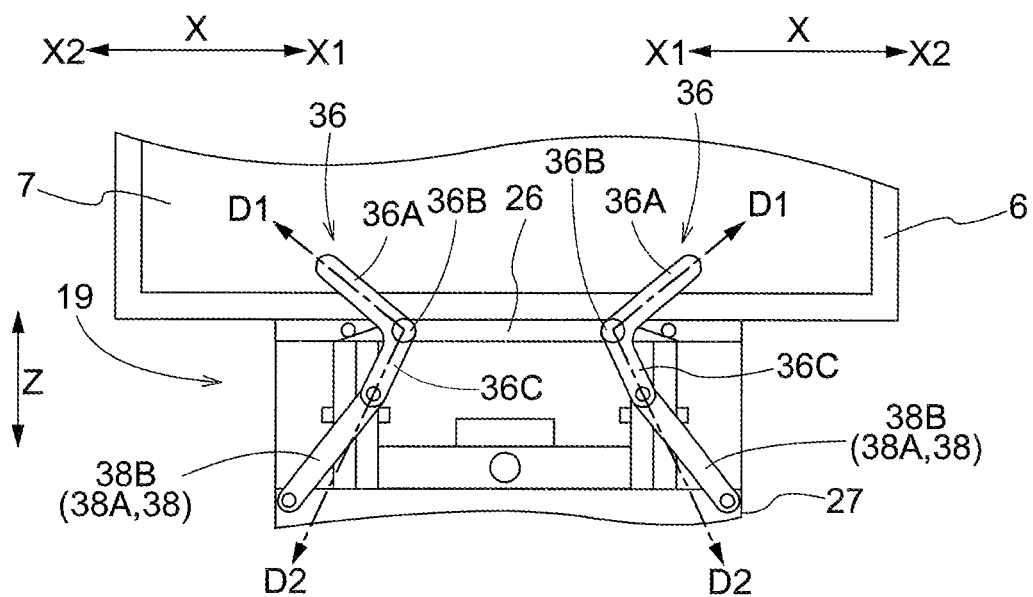
FIG. 11 is a partial enlarged view of FIG. 4.

Each connected portion 36B is connected to the support member 26 such that the connected portion 36B is rotatable about an axis extending along the lateral width direction Y. And, as shown in FIG. 4, when the first preventing members 36 are in respective preventing attitudes, the preventing portion 36A of each first preventing member 36 extends, from its connected portion 36B, in a diagonally upward direction between the second-side direction X2 along the front-and-back direction X and a vertical direction Z whereas, as shown in FIG. 3, the first preventing members 36 are in respective retracted attitudes, the preventing portion 36A of each first preventing member 36 extends, from the connected portion 36B, in the second-side direction X2 along the front-and-back direction X. Thus, the direction in which the preventing portion 36A of either of the first preventing member 36 extends from the corresponding connected portion 36B changes depending on the attitude of the first preventing member 36. The direction in which the preventing portion 36A of a first preventing member 36 extends from the connected portion 36B is, or corresponds to, the first direction D1 for that first preventing member 36 which is perpendicular to the lateral width direction Y so that the preventing portion 36A extends in the first direction D1 from the connected portion 36B (see FIGS. 10 and 11). Therefore, the first direction for one first preventing member 36 may be different from the first direction D1 for the other or another preventing member 36 as in the present example.

Also, as shown in FIG. 4, when the first preventing members 36 are in respective preventing attitudes, the pivot arm portion 36C of each first preventing member 36 extends, from the connected portion 36B, in a diagonally downward direction between the second-side direction X2 along the front-and-back direction X and a vertical direction Z whereas, as shown in FIG. 3, the first preventing members 36 are in respective retracted attitudes, the pivot arm portion 36C of each first preventing member 36 extends downward from the connected portion 36B. Thus, the direction in which the pivot arm portion 36C of a first preventing member 36 extends from the corresponding connected portion 36B changes depending on the attitude of the first preventing member 36. The direction in which the pivot arm portion 36C of a first preventing member 36 extends from the connected portion 36B is, or corresponds to, the second direction D2 for that first preventing member 36 which is perpendicular to the lateral width direction Y so that the preventing portion 36A extends in the second direction D2 from the connected portion 36B. Therefore, the second direction D2 for one first preventing member 36 may be different from the second direction for the other or another preventing member 36 as in the present example. For example, the first direction D1 and the second direction D2 for each first preventing member 36 is perpendicular to each other.

Each preventing portion 36A has a portion that is located higher than the lower end of the lid 7 of a supported container WS when the first preventing member 36 (that is the preventing portion 36A is a portion of) is in the preventing attitude, and that is located lower than the lower end of the lid 7 of the supported container WS when the first preventing member 36 is in the retracted attitude. This portion overlaps with the lid 7 as seen along the lateral width direction Y when the first preventing member 36 is in the preventing attitude. The distance along the lateral width direction Y between each preventing portion 36A and the lid 7 properly attached to the supported container WS is set to be less than the depth by which the lid 7 fits into the main body portion 6 in the second-side direction Y2 along the lateral width direction Y so that the lid 7 is prevented from coming off from the supported container WS as a result of the preventing portions 36A coming into contact with the lid 7 that became detached from the supported container WS, thus preventing the lid 7 from falling off from the article transport vehicle 2. In addition, each pivot arm portion 36C is located lower than the corresponding preventing portion 36A when the first preventing member 36 is in the preventing attitude as well as when the first preventing member 36 is in the retracted attitude.

[Movement Coupling Mechanism]

The movement coupling mechanism 38 has a linkage mechanism 38A pivotably connected to both the movable member 27 and the first preventing members 36. The linkage mechanism 38A includes links 38B each of which is pivotably connected to both the movable member 27 and the pivot arm portion 36C of corresponding first preventing member 36. A link 38B is provided for each of the first preventing members 36; so, the linkage mechanism 38A has a pair of the links 38B.

Each link 38B is formed in a shape of an "I" (i.e., to be generally linear in shape) as seen along the lateral width direction Y, has one end connected to the movable member 27 such that the link 38B is pivotable about an axis extending along the lateral width direction Y, and has the other end connected to an end of corresponding pivot arm portion 36C such that the link 38B is pivotable about an axis extending along the lateral width direction Y. And the location of connection of each link 38B to the movable member 27 is located to the corresponding second-side X2 (or displaced in the corresponding second-side direction X2) along the front-and-back direction X with respect to the location of connection of the link 38B to the corresponding pivot arm portion 36C. Thus, each link 38B extends, from the movable member 27, in a diagonally upward direction between the first-side direction X1 along the front-and-back direction X and the vertical direction Z when the corresponding first preventing member 36 is in the preventing attitude as well as when the first preventing member 36 is in the retracted attitude.

And, as shown in FIGS. 3 and 4, when the support member 26 is raised with respect to the movable member 27, the movement coupling mechanism 38 pulls the pivot arm portion 36C of each first preventing member 36 in the retracted attitude in the second-side direction X2 along the front-and-back direction X by means of the corresponding link 38B, as a result of which, each first preventing member 36 is placed in the preventing attitude (see FIG. 4). In addition, the movement coupling mechanism 38 moves each first preventing member 36 to the retracted attitude (see FIG. 4) as a result of each link 38B pushing the pivot arm portion 36C of corresponding first preventing member 36 in the preventing attitude in the first-side direction X1 along the front-and-back direction X when the support member 26 is lowered with respect to the movable member 27. Thus, the movement coupling mechanism 38 is configured to move each first preventing member 36 from the retracted attitude to the preventing attitude in response to the support member 26 being raised and is configured to move each first preventing member 36 from the preventing attitude to the retracted attitude in response to the support member 26 being lowered.

[Second Preventing Member, Pivoting Motor, Lid Detection Sensor]

The second preventing member 37 is formed in a shape of an "I" (i.e., to be generally linear in shape) as seen along the lateral width direction Y, and its one end portion is connected to a relay member drivingly rotated by a pivoting motor 39 (an electric motor used to pivot the second preventing member 37). The pivoting motor 39 is fixed to the cover member 21. And the attitude of the second preventing member 37 is changed to a preventing attitude (position shown in FIG. 4), and to a retracted attitude (position shown in FIG. 3) as a result of being pivoted about an axis extending along the lateral width direction Y by the pivoting motor 39. When in the retracted attitude, the second preventing member 37 extends along the front-and-back direction X and the entire second preventing member 37 is located higher than the supported container WS. In addition, when in the preventing attitude, the second preventing member 37 extends along the vertical direction Z and a portion of the second preventing member 37 is located lower than the upper end of the lid 7 so that this portion of the second preventing member 37 overlaps with the lid 7 as seen along the lateral width direction Y. Note that the position of the second preventing member 37 in the preventing attitude is, or corresponds to, the restricting position of the second preventing member 37 whereas the position of the second preventing member 37 in the retracted attitude is, or corresponds to, the retracted position of the second preventing member. In addition, the pivoting motor 39 is, or corresponds to, the actuator configured to move the second preventing member 37 to the restricting position and to the retracted position.

The second preventing member 37 is supported by the cover member 21 such that, when the support portion 19 is in the retracted position, the second preventing member 37 is located on the first-side Y1, along the lateral width direction Y, of the lid 7 of the supported container WS. Note that the second preventing member 37 is supported by the cover member 21 through a pivoting motor 39. A preventing attitude of the second preventing member 37 is an attitude in which, when the support member 26 is at its raised height, the second preventing member 37 protrudes downward with respect to the upper end (i.e., upper edge) of the lid 7 (i.e., at least a portion of the second preventing member 37 is located higher than the upper end of the lid 7). In addition, a retracted attitude of the second preventing member 37 is an attitude in which, when the support member 26 is at its raised height, the second preventing member 37 is retracted upward with respect to the upper end of the lid 7 so as to be located higher than the upper end of the lid 7.

when the support member 26 is in the retracted position, the distance along the lateral width direction Y between the second preventing member 37 and the lid 7 properly attached to the supported container WS is set to be less than the depth by which the lid 7 fits into the main body portion 6 in the second-side direction Y2 along the lateral width direction Y. Thus, the lid 7 is prevented from falling off from the supported container WS as a result of the second preventing member 37 coming into contact with the lid 7 that became detached from the supported container WS, thus preventing the lid 7 from falling off from the article transport vehicle 2.

A lid detection sensor 40 is fixed to a portion (of the cover member 21) that is located higher than the supported container WS. The lid detection sensor 40 emits light (used for detection) downward and receives reflected light from a reflecting plate fixed to a portion (of the cover member 21) that is located lower than the supported container WS. The emitted light and the reflected light travel within the width of the lid 7 along the front-and-back direction X and between the first preventing members 36 and the second preventing member 37 on the one hand and the supported container WS on the other hand along the lateral width direction Y. In other words, the lid detection sensor 40 is so located that it does not detect the lid 7 when the lid 7 of the supported container WS is properly attached to the main body portion 6 and that the lid detection sensor 40 detects the contacted lid 7 if the lid 7 becomes detached from the main body portion 6 and is contacted by at least one of the first preventing members 36 and the second preventing member 37. Thus, the lid detection sensor 40 detects that the lid 7 has become detached from the supported container WS.

[Controller]

The article transport vehicle 2 incudes a controller H which controls the operation of the article transport vehicle 2. By controlling the drive motor 17, the controller H causes the travel portion 13 to travel to, and stop at, a predetermined travel stop position for a storage rack portion of the storage rack 3 that is the transport target (i.e., the destination of a transport operation). In addition, the controller H causes the container W to be transferred between the article transport vehicle 2 and the storage rack 3 by causing the support member 26 to be projected and retracted along the lateral width direction Y by controlling the extending and retracting motor 24, and by causing the support member 26 to be raised and lowered (or vertically moved) by controlling the vertical movement motor 32. In addition, the controller H controls the pivoting motor 39 to change the attitude of the second preventing member 37 to the preventing attitude and to the retracted attitude. In addition, the controller H causes the article transport vehicle 2 to make an emergency stop if the controller H determines, based on a signal from the lid detection sensor 40, that the lid 7 became detached from the supported container WS.

The controller H controls the article transport vehicle 2 based on transport information from a superordinate controller (not shown) to perform a delivering operation for delivering a container W to the storage rack 3, and a receiving operation for receiving a container W from the storage rack 3.

In a receiving operation, the controller H performs, based on transport information, a receiving travel control in which the drive motor 17 is controlled to cause the article transport vehicle 2 to travel to and stop at a travel stop position set for a storage rack portion in which the container W to be transported is stored. Note that, when performing a receiving travel control, no container W is supported by the support member 26 and the support member 26 is in the retracted position and at the lowered height. In addition, the first preventing members 36 are in respective retracted attitudes, and the second preventing member 37 is in the retracted attitude.

Figure 5:
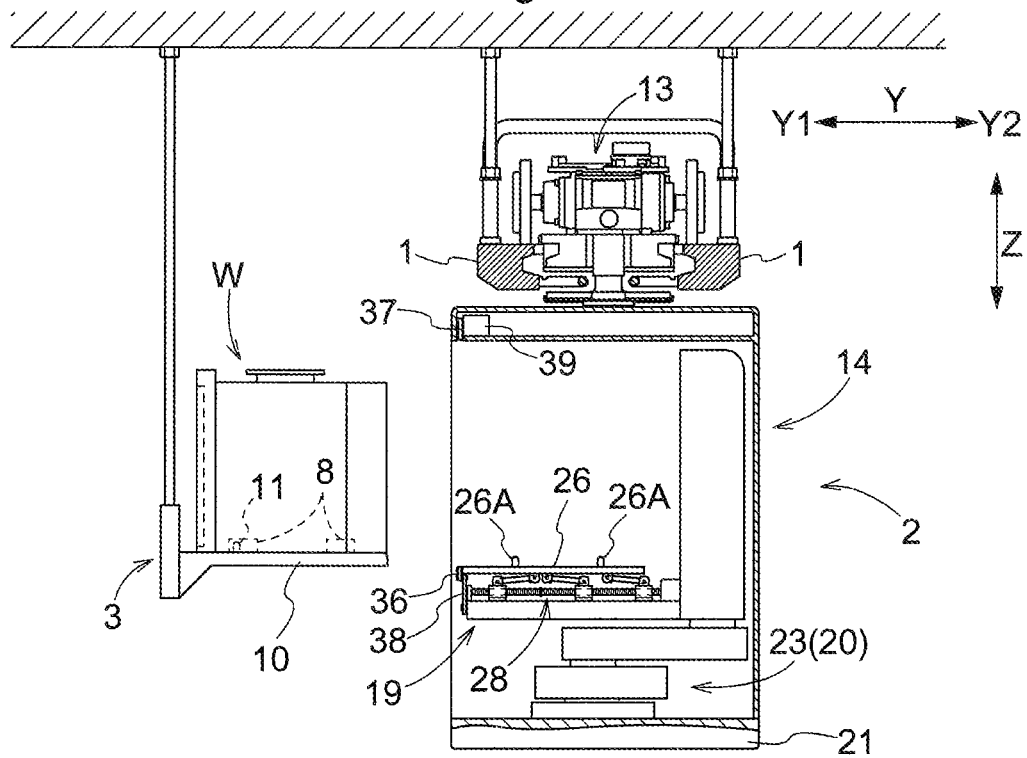
FIG. 5 is a partial vertical sectional rear view of the article transport vehicle with its support portion in a retracted position and the support member at a lowered position.
Figure 6:
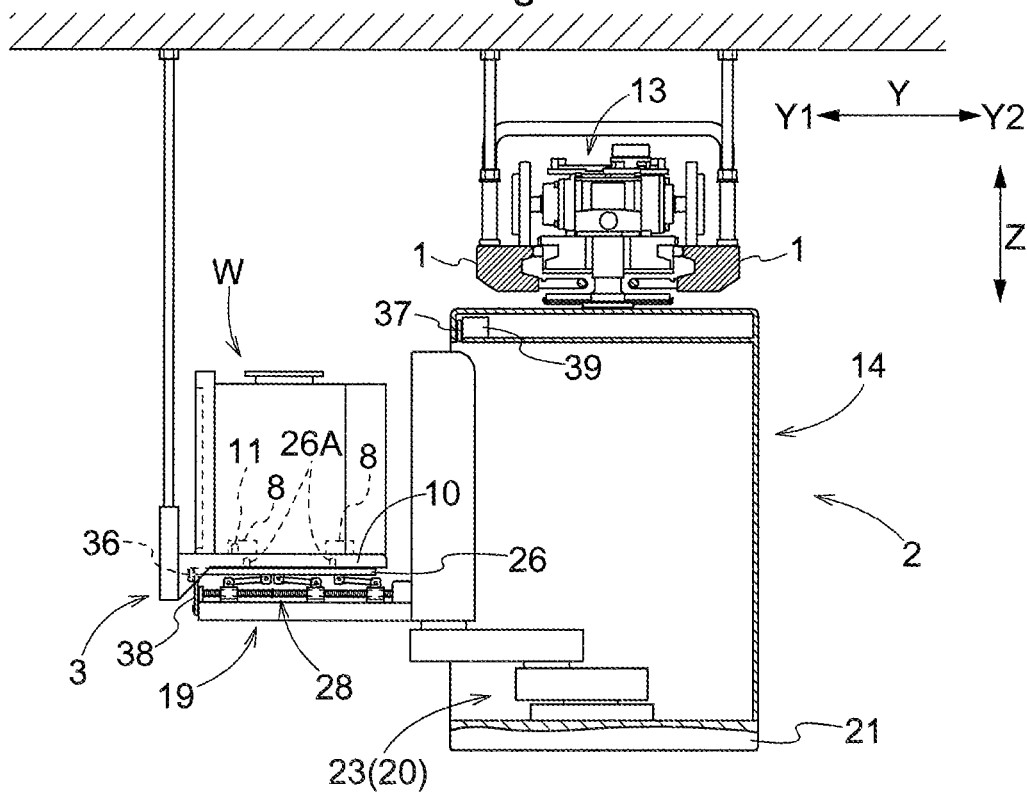
FIG. 6 is a partial vertical sectional rear view of the article transport vehicle with its support portion in a projected position and the support member at the lowered position.
Figure 7:
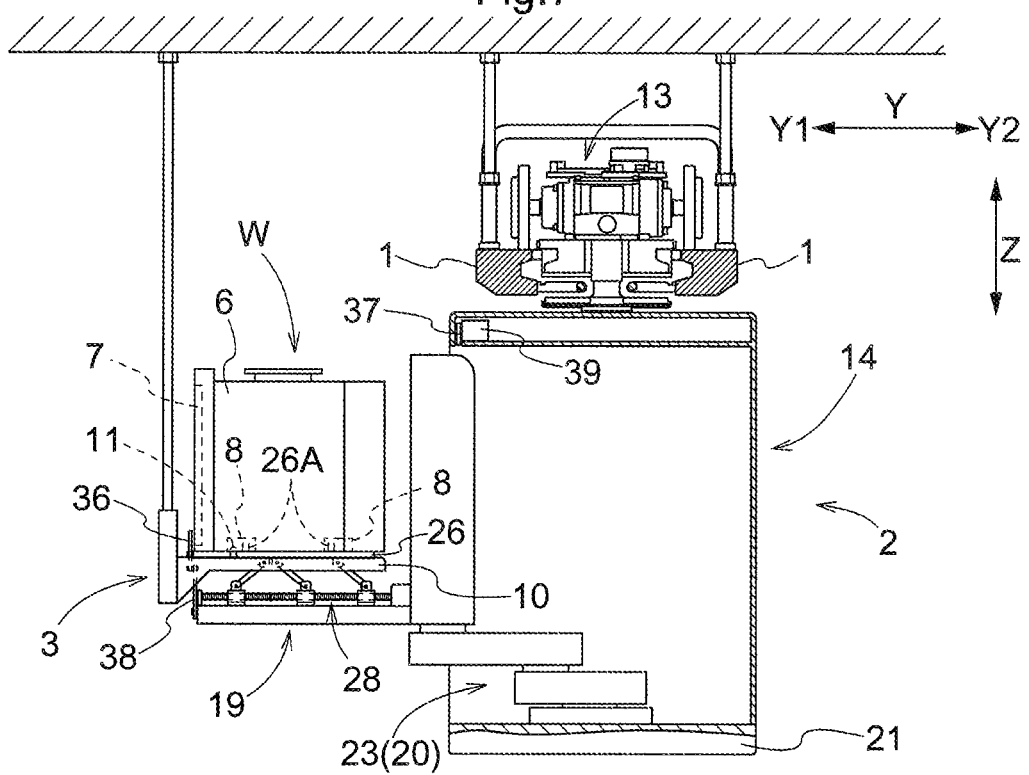
FIG. 7 is a partial vertical sectional rear view of the article transport vehicle with its support portion in the projected position and the support member at a raised position.
Figure 8:
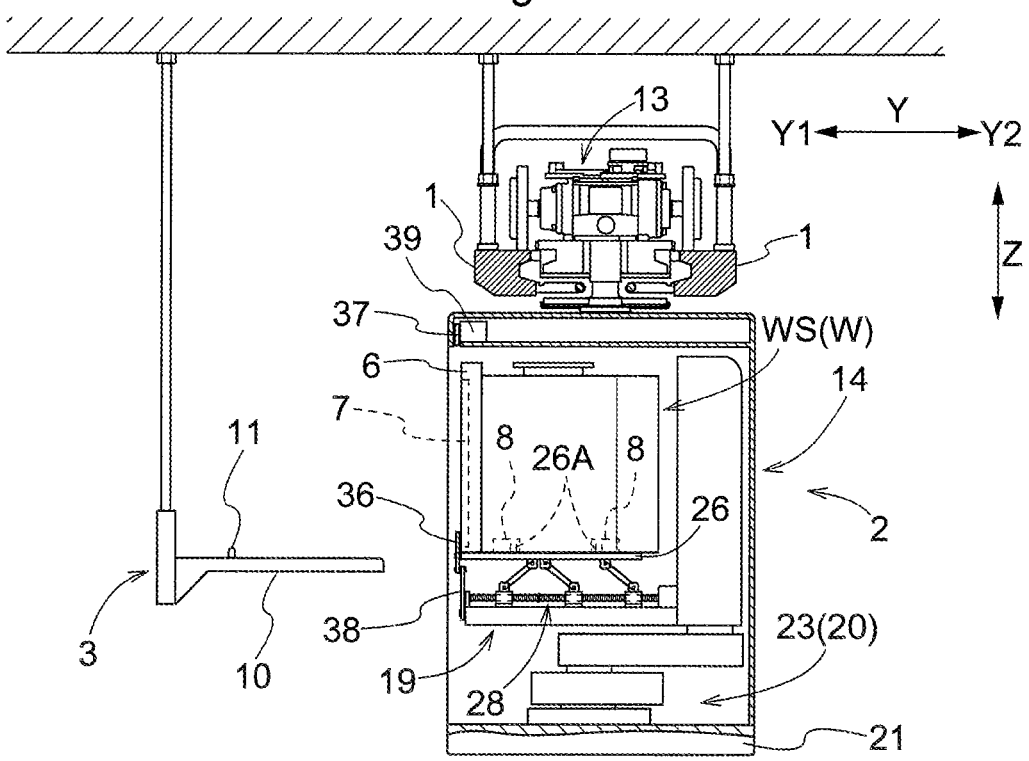
FIG. 8 is a partial vertical sectional rear view of the article transport vehicle with its support portion in the retracted position and the support member at the raised position.
Figure 9:
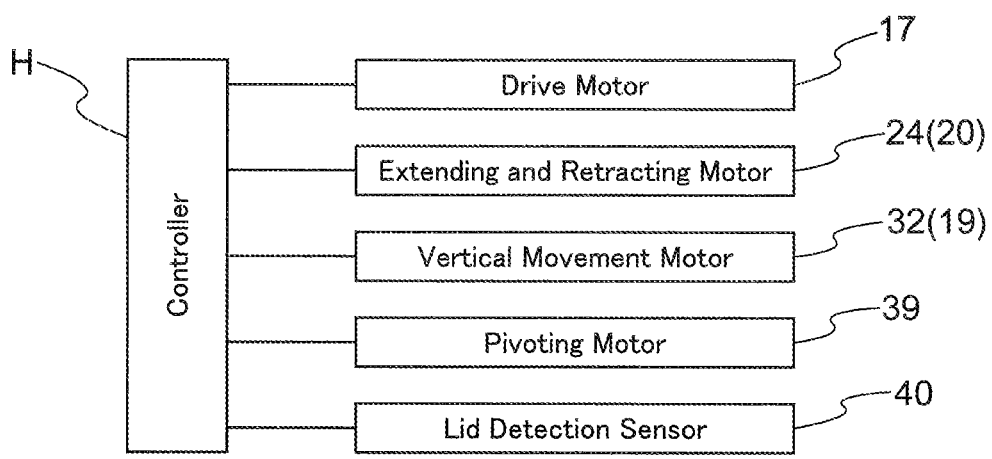
FIG. 9 is a control block diagram.

And, in the receiving operation, after performing the receiving travel control as described above, the controller H performs a receiving transfer control in which the extending and retracting motor 24 and the vertical movement motor 32 are controlled to transfer the container W on a storage support member 10 to the support member 26. In this receiving transfer control, firstly, as shown in FIG. 5, FIG. 6, and FIG. 7 in that order, with the article transport vehicle 2 at rest at a travel stop position, the extending and retracting motor 24 and the vertical movement motor 32 are controlled to place the container W on the support member 26 by causing the support portion 19 (thus the support member 26) to be projected to the projected position and then causing the support member 26 to be raised to the raised height. Thus, the attitudes of the first preventing members 36 are changed from respective retracted attitudes to respective preventing attitudes as the support member 26 is raised. And, in the receiving transfer control, next, as shown in FIG. 8, after the extending and retracting motor 24 is controlled to retract the support member 26 to the retracted position, the pivoting motor 39 is controlled to change the attitude of the second preventing member 37 to the preventing attitude as shown in FIG. 2.

In a delivering operation, the controller H performs, based on transport information, a delivering travel control in which the drive motor 17 is controlled to cause the article transport vehicle 2 to travel to and stop at a travel stop position set for a storage rack portion to which a container W is to be transported. Note that, when performing a delivering travel control, the support member 26 is supporting the container W and the support portion 19 (and thus the support member 26) is in the retracted position and the support member 26 is at the raised height. In addition, the first preventing members 36 are in respective preventing attitudes, and the second preventing member 37 is in the preventing attitude.

And, in the delivering operation, after performing the delivering travel control as described above, the controller H performs a delivering transfer control in which the extending and retracting motor 24 and the vertical movement motor 32 are controlled to transfer the container W on the support member 26 to a storage support member 10. In this delivering transfer control, firstly, as shown in FIG. 2 and FIG. 8 in that order, with the article transport vehicle 2 at rest at a travel stop position, the pivoting motor 39 is controlled to change the attitude of the second preventing member 37 to the retracted attitude, and subsequently, as shown in FIG. 7 and FIG. 6 in that order, the extending and retracting motor 24 and the vertical movement motor 32 are controlled to cause the support portion 19 (thus the support member 26) to be projected to the projected position and then to cause the support member 26 to be lowered to the lowered height to place the container W on the storage support member 10. Thus, the attitudes of the first preventing members 36 are changed from respective preventing attitudes to respective retracted attitudes as the support member 26 is lowered. And then in the delivering transfer control, the extending and retracting motor 24 is controlled to retract the support member 26 to the retracted position as shown in FIG. 5.

Other embodiments of an article transport vehicle are described next.

(1) In the embodiment described above, the movement coupling mechanism 38 includes a linkage mechanism which moves the first preventing members 36 (with respect to the support member 26, thus with respect to the lower end (i.e., lower edge) of the lid 7 of any supported container WS) when the support member 26 is moved such that the first preventing members 36 are moved (with respect to the support member 26) when the support member 26 is raised and lowered. However, instead of the linkage mechanism 38A, the movement coupling mechanism 38 may include other arrangement to move the first preventing members 36 when the support member 26 is raised and lowered. In addition, each first preventing member 36 is generally formed in a shape of an "L" as seen along the lateral width direction Y in the embodiment described above. However, each first preventing member 36 may be generally formed in a shape of an "I" (i.e., generally linear in shape). And as such, the shape of each first preventing member 26 may be modified suitably. In addition, the first preventing members 36 are pivotable to be moved to respective restricting positions and retracted positions in the embodiment described above. However, one or more first preventing members 36 may be provided that can be linearly moved (e.g., slid) along the vertical direction Z to be moved to respective restricting positions and retracted positions.

More specifically, for example, the movement coupling mechanism 38 may include one or more pinion gears that are rotatably supported by the support member 26, one or more racks each of which is fixed to the movable member 27 and is meshed with the corresponding pinion gear. And one or more first preventing members 36 may be provided each of which is generally formed to be linear in shape, slidably attached to the support member 26, and is meshed with the corresponding pinion gear. And, the arrangement may be such that, as the support member 26 is raised (or lowered) with respect to the movable member 27, each pinion gear is raised (or lowered) with respect to the corresponding rack which causes each pinion gear to rotate which rotation, in turn, causes the corresponding first preventing member to be moved (e.g. slid) along the vertical direction Z.

(2) In the embodiment described above, a container W is a FOUP (Front Opening Unified Pod); however, the container W may be of other type, such as a FOSB (Front Opening Shipping Box), etc.

(3) In the embodiment described above, the support member 26 supports a supported container WS in an orientation in which its opening 5 faces the direction in which the support portion 19 is projected (i.e., in the first-side direction Y1 along the lateral width direction Y). However, the support member 26 may support a supported container WS in an orientation in which its opening 5 faces the direction in which the support portion 19 is retracted (i.e., in the second-side direction Y2 along the lateral width direction Y). In this case, the first preventing members 36 may be connected to the portion (of the support member 26) that is on the retracting direction side with respect to the supported container WS.

(4) In the embodiment described above, the first preventing members 36 and the second preventing member 37 are provided. However, of these two types of preventing members, only one or more first preventing members may be provided.

(5) In addition, an arrangement disclosed in any of the embodiments described above can also be used in combination with any arrangement disclosed in any other embodiment unless inconsistency arises. Regarding any other arrangements and features, the embodiments disclosed in the present description are provided for the purposes of illustration only regarding all aspects. Therefore, it is possible to make various suitable changes without departing from the spirit of the present disclosure.

Summary of Embodiments

A brief summary of the article transport vehicle described above is provided next.

An article transport vehicle comprises: a travel portion configured to travel along a travel path; a support portion configured to support a container; and a moving mechanism configured to move the support portion along a lateral width direction which crosses the travel path as seen along a vertical direction, wherein the moving mechanism is configured to move the support portion to a projected position at which the support portion is projected along the lateral width direction with respect to the travel portion, and to a retracted position at which the support portion is closer to the travel portion than at the projected position, wherein the support portion includes a support member configured to support a bottom surface of a container from below, a movable member configured to be moved along the lateral width direction by the moving mechanism, and a vertically moving mechanism configured to move the support member along the vertical direction with respect to the movable member, wherein the container includes a main body portion which has an opening which faces a direction along the lateral width direction when the container is supported by the support portion, and a lid for closing the opening, wherein the article transport vehicle further comprises one or more fall preventing members configured to prevent a lid of a supported container which is the container that is supported by the support member from falling, and a movement coupling mechanism configured to move the one or more fall preventing members when the support member is moved, wherein each of the one or more fall preventing members is located on the opposite side of the lid of the supported container from the main body portion, and is configured to be movable to a preventing position in which the fall preventing member protrudes upward with respect to a lower end of the lid, and to a retracted position in which the fall preventing member is retracted so as to be located lower than the lower end of the lid, and wherein the movement coupling mechanism is configured to move the one or more fall preventing members from respective retracted positions to respective preventing positions when the support member is raised, and to move the one or more fall preventing members from respective preventing positions to respective retracted positions when the support member is lowered.

With such an arrangement, when transferring a container from a transfer target location located to one side of the travel path to the support member with the travel portion at rest at a position that corresponds to the transfer target location, the support portion is moved from the retracted position to the projected position by the moving mechanism, then the support member of the support portion is raised with respect to the movable member by the vertically moving mechanism to place the container at the transfer target location on the support member. Subsequently, the support portion is moved from the projected position to the retracted position by the moving mechanism. And during this operation, the one or more fall preventing members are moved from respective retracted positions to respective restricting positions by the movement coupling mechanism when the support member is raised with respect to the movable member. Therefore, the support member has been lowered and the one or more fall preventing members are in respective retracted positions when moving the support member (which is not supporting any container) from the retracted position to the projected position. This can make it unlikely for the one or more fall preventing members to come into contact with the container located at the transfer target location. And when moving the support portion which now supports the container from the projected position to the retracted position, the support member has been raised and the one or more fall preventing members are in respective preventing positions, and, therefore, can prevent the lid of the container that may have become detached from the main body portion from falling off from the article transport vehicle.

In addition, when transferring a container from the support member to a transfer target location with the travel portion at rest at a position that corresponds to a transfer target location, the support portion is moved from the retracted position to the projected position by the moving mechanism, then the support member of the support portion is lowered with respect to the movable member by the vertically moving mechanism to unload the container (on the support member) to the transfer target location. Subsequently, the support portion is moved from the projected position to the retracted position by the moving mechanism. During this operation, the one or more fall preventing members are moved from respective restricting positions to respective retracted positions by the movement coupling mechanism when the support member is lowered with respect to the movable member. Therefore, when moving the support portion which supports the container from the retracted position to the projected position, the support member is at the raised height and the one or more fall preventing members are in respective preventing positions, and, therefore, can prevent the lid of the container that may have become detached from the main body portion from falling off from the article transport vehicle. And, the support member is at lowered height and the one or more fall preventing members are in respective retracted positions when moving the support member which is not supporting any container from the projected position to the retracted position. This can make it unlikely for the one or more fall preventing members to come into contact with the container located at the transfer target location.

And the one or more fall preventing members are moved to respective restricting positions and to respective retracted positions by the movement coupling mechanism when the support member is raised and lowered. Thus, it is not necessary to provide an actuator exclusively for moving the one or more fall preventing members to respective restricting positions and to respective retracted positions. In addition, this arrangement makes it unnecessary to control such an actuator to operate when the support member is vertically moved. Therefore, the above arrangement makes it possible to prevent a lid from falling off from an article transport vehicle by means of one or more fall preventing members while making it possible to simplify the structure and/or an arrangement of an article transport vehicle compared with a case where an actuator is provided exclusively for moving such one or more fall preventing members.

Here, each of the one or more fall preventing members is preferably connected to the support member so as to be pivotable about an axis extending along the lateral width direction, and is pivotable to the restricting position and to the retracted position, wherein the movement coupling mechanism preferably includes a linkage mechanism pivotably connected to the movable member and the one or more fall preventing members.

With such an arrangement, the one or more fall preventing members can be moved to respective restricting positions and to respective retracted positions by changing the attitude of the linkage mechanism as a result of the fact that the support member is vertically moved with respect to the movable member. As such, the one or more fall preventing members can be moved to respective restricting positions and to respective retracted positions by the linkage mechanism of the movement coupling mechanism, when the support member is vertically moved.

In addition, each of the one or more fall preventing members preferably has a connected portion connected to the support member, a preventing portion extending along a first direction perpendicular to the lateral width direction from the connected portion, and a pivot arm portion extending from the connected portion along a second direction which is perpendicular to the lateral width direction and crosses the first direction, wherein the preventing portion of each of the one or more fall preventing members preferably has a portion that is located higher than the lower end of the lid of the supported container when the fall preventing member is in the preventing position, and that is located lower than the lower end of the lid of the supported container when the fall preventing member is in the retracted position, wherein the pivot arm portion of each of the one or more fall preventing members is preferably located lower than the corresponding preventing portion when the fall preventing member is in the restricting position and when the fall preventing member is in the retracted position, and wherein the linkage mechanism preferably includes one or more links each of which is pivotably connected to both the movable member and the pivot arm portion of corresponding one of the one or more fall preventing members.

With such an arrangement, each of the one or more links is pivoted when the support member is vertically moved with respect to the movable member. And the pivoting of a link causes the corresponding pivot arm portion to be pivoted, which in turn causes corresponding preventing portion to be raised and lowered and thus the corresponding fall preventing member to be moved to its preventing position and to the retracted position. Thus, by arranging both the one or more fall preventing members and the one or more links to be pivotable, the one or more fall preventing members can be caused to be moved when the one or more links are moved, by a relatively simple arrangement.

Also, with a projecting side being a side along the lateral width direction on which the projected position exists with respect to the retracted position, the support member preferably supports the supported container in an orientation in which the opening faces the projecting side, wherein the one or more fall preventing members are preferably connected to an end portion of the support member that is on the projecting side.

With such an arrangement, since the support member supports the supported container in an orientation in which the opening faces the projecting side, the one or more fall preventing members are located on the projecting side with respect to the lid. When moving the support member that is not supporting any container from the retracted position to the projected position or from the projected position to the retracted position, the end portion of the support member that is on the projecting side is moved to the projecting side of the container at a transfer target location. However, since the one or more fall preventing members are in respective retracted positions, any incident of the one or more fall preventing members (which are connected to the end portion of the support member) coming into contact with the container at the transfer target location can be avoided.

In addition, with the one or more fall preventing members being one or more first preventing members, and with a height of the support member at which the one or more first preventing members are in respective restricting positions being a raised height, the article transport vehicle preferably further comprises a second preventing member configured to prevent the lid of the supported container from falling, an actuator configured to move the second preventing member, and an intermediate portion which is supported by the travel portion and supports the moving mechanism, wherein the second preventing member is preferably supported by the intermediate portion such that the second preventing member is located on the opposite side of the lid of the supported container from the main body portion when the support portion is in the retracted position, wherein the actuator preferably moves the second preventing member to a restricting position at which at least a portion of the second preventing member protrudes downward with respect to an upper end of the lid when the support member at the raised height, and to a retracted position at which the second preventing member is retracted upward with respect to the upper end of the supported container when the support member is at the raised height.

With such an arrangement, the second preventing member in the retracted position is located higher than the supported container supported by the support member in the raised height. Thus, any incident of the second preventing member coming into contact with the supported container can be avoided by placing the second preventing member in the retracted position when the support portion with its support member in the raised height is moved to the retracted position and to the projected position. And when the support portion is in the retracted position and the support member is in the raised height, any incident of the lid of the container becoming detached from the main body portion and falling from the article transport vehicle can be prevented by the second preventing member by placing the second preventing member in the restricting position. In addition, when the support member is at the raised height as described above, the one or more first preventing members have also been moved to respective restricting positions. Thus, when the support portion is in the retracted position and the support member is in the raised height, any incident of the lid of the container becoming detached from the main body portion and falling from the article transport vehicle can be prevented by the one or more first preventing members and the second preventing member with a lower portion of the lid being contacted by the one or more first preventing members and with an upper portion of the lid being contacted by the second preventing member.

What is claimed is:

1. An article transport vehicle comprising:
   a travel portion configured to travel along a travel path;
   a support portion configured to support a container; and
   a moving mechanism configured to move the support portion along a lateral width direction which crosses the travel path as seen along a vertical direction,
   wherein the moving mechanism is configured to move the support portion to a projected position at which the support portion is projected along the lateral width direction with respect to the travel portion, and to a retracted position at which the support portion is closer to the travel portion than at the projected position,
   wherein the support portion includes a support member configured to support a bottom surface of a container from below, a movable member configured to be moved along the lateral width direction by the moving mechanism, and a vertically moving mechanism configured to move the support member along the vertical direction with respect to the movable member,
   wherein the container includes a main body portion which has an opening which faces a direction along the lateral width direction when the container is supported by the support portion, and a lid for closing the opening,
   wherein the article transport vehicle further comprises one or more fall preventing members configured to prevent a lid of a supported container which is the container that is supported by the support member from falling, and a movement coupling mechanism configured to move the one or more fall preventing members when the support member is moved,
   wherein each of the one or more fall preventing members is located on the opposite side of the lid of the supported container from the main body portion, and is configured to be movable to a preventing position in which the fall preventing member protrudes upward with respect to a lower end of the lid, and to a retracted position in which the fall preventing member is retracted so as to be located lower than the lower end of the lid,
   wherein the movement coupling mechanism is configured to move the one or more fall preventing members from respective retracted positions to respective preventing positions when the support member is raised, and to move the one or more fall preventing members from respective preventing positions to respective retracted positions when the support member is lowered,
   wherein each of the one or more fall preventing members comprises a preventing portion extending along a first direction perpendicular to the lateral width direction and a pivot arm portion extending along a second direction which is perpendicular to the lateral width direction and different from the first direction,
   wherein the preventing portion of each of the one or more fall preventing members has a portion that overlaps the lid of the supported container when the fall preventing member is in the preventing position, and does not overlap the lid of the supported container when the fall preventing member is in the retracted position, and
   wherein the pivot arm portion of each of the one or more fall preventing members is located lower than the corresponding preventing portion when the fall preventing member is in the restricting position and when the fall preventing member is in the retracted position.

2. The article transport vehicle as defined in claim 1, wherein each of the one or more fall preventing members is connected to the support member so as to be pivotable about an axis extending along the lateral width direction, and is pivotable to the preventing position and to the retracted position, and
   wherein the movement coupling mechanism includes a linkage mechanism pivotably connected to the movable member and the one or more fall preventing members.

3. The article transport vehicle as defined in claim 2, wherein each of the one or more fall preventing members further comprises a connected portion connected to the support member,
   wherein the preventing portion extends along the first direction from the connected portion, and the pivot arm portion extends from the connected portion along the second direction which crosses the first direction, wherein the preventing portion of each of the one or more fall preventing members has a portion that is located higher than the lower end of the lid of the supported container when the fall preventing member is in the preventing position, and that is located lower than the lower end of the lid of the supported container when the fall preventing member is in the retracted position, and wherein the linkage mechanism includes one or more links each of which is pivotably connected to both the movable member and the pivot arm portion of corresponding one of the one or more fall preventing members.

4. The article transport vehicle as defined in claim 3, wherein with a projecting side being a side along the lateral width direction on which the projected position exists with respect to the retracted position, the support member supports the supported container in an orientation in which the opening faces the projecting side, and wherein the one or more fall preventing members are connected to an end portion of the support member that is on the projecting side.

5. The article transport vehicle as defined in claim 4, wherein with the one or more fall preventing members being one or more first preventing members, and with a height of the support member at which the one or more first preventing members are in respective restricting positions being a raised height, the article transport vehicle further comprises a second preventing member configured to prevent the lid of the supported container from falling, an actuator configured to move the second preventing member, and an intermediate portion which is supported by the travel portion and supports the moving mechanism, wherein the second preventing member is supported by the intermediate portion such that the second preventing member is located on the opposite side of the lid of the supported container from the main body portion when the support portion is in the retracted position, and wherein the actuator moves the second preventing member to a restricting position at which at least a portion of the second preventing member protrudes downward with respect to an upper end of the lid when the support member is at the raised height, and to a retracted position at which the second preventing member is retracted upward with respect to the upper end of the supported container when the support member is at the raised height.

6. The article transport vehicle as defined in claim 3, wherein with the one or more fall preventing members being one or more first preventing members, and with a height of the support member at which the one or more first preventing members are in respective restricting positions being a raised height, the article transport vehicle further comprises a second preventing member configured to prevent the lid of the supported container from falling, an actuator configured to move the second preventing member, and an intermediate portion which is supported by the travel portion and supports the moving mechanism, wherein the second preventing member is supported by the intermediate portion such that the second preventing member is located on the opposite side of the lid of the supported container from the main body portion when the support portion is in the retracted position, and wherein the actuator moves the second preventing member to a restricting position at which at least a portion of the second preventing member protrudes downward with respect to an upper end of the lid when the support member is at the raised height, and to a retracted position at which the second preventing member is retracted upward with respect to the upper end of the supported container when the support member is at the raised height.

7. The article transport vehicle as defined in claim 2, wherein with a projecting side being a side along the lateral width direction on which the projected position exists with respect to the retracted position, the support member supports the supported container in an orientation in which the opening faces the projecting side, and wherein the one or more fall preventing members are connected to an end portion of the support member that is on the projecting side.

8. The article transport vehicle as defined in claim 7, wherein with the one or more fall preventing members being one or more first preventing members, and with a height of the support member at which the one or more first preventing members are in respective restricting positions being a raised height, the article transport vehicle further comprises a second preventing member configured to prevent the lid of the supported container from falling, an actuator configured to move the second preventing member, and an intermediate portion which is supported by the travel portion and supports the moving mechanism, wherein the second preventing member is supported by the intermediate portion such that the second preventing member is located on the opposite side of the lid of the supported container from the main body portion when the support portion is in the retracted position, and wherein the actuator moves the second preventing member to a restricting position at which at least a portion of the second preventing member protrudes downward with respect to an upper end of the lid when the support member is at the raised height, and to a retracted position at which the second preventing member is retracted upward with respect to the upper end of the supported container when the support member is at the raised height.

9. The article transport vehicle as defined in claim 2, wherein with the one or more fall preventing members being one or more first preventing members, and with a height of the support member at which the one or more first preventing members are in respective restricting positions being a raised height, the article transport vehicle further comprises a second preventing member configured to prevent the lid of the supported container from falling, an actuator configured to move the second preventing member, and an intermediate portion which is supported by the travel portion and supports the moving mechanism, wherein the second preventing member is supported by the intermediate portion such that the second preventing member is located on the opposite side of the lid of the supported container from the main body portion when the support portion is in the retracted position, and wherein the actuator moves the second preventing member to a restricting position at which at least a portion of the second preventing member protrudes downward with respect to an upper end of the lid when the support member is at the raised height, and to a retracted position at which the second preventing member is retracted upward with respect to the upper end of the supported container when the support member is at the raised height.

10. The article transport vehicle as defined in claim 1, wherein with the one or more fall preventing members being one or more first preventing members, and with a height of the support member at which the one or more first preventing members are in respective restricting positions being a raised height, the article transport vehicle further comprises a second preventing member configured to prevent the lid of the supported container from falling, an actuator configured to move the second preventing member, and an intermediate portion which is supported by the travel portion and supports the moving mechanism, wherein the second preventing member is supported by the intermediate portion such that the second preventing member is located on the opposite side of the lid of the supported container from the main body portion when the support portion is in the retracted position, and wherein the actuator moves the second preventing member to a restricting position at which at least a portion of the second preventing member protrudes downward with respect to an upper end of the lid when the support member is at the raised height, and to a retracted position at which the second preventing member is retracted upward with respect to the upper end of the supported container when the support member is at the raised height.

11. An article transport vehicle comprising:
a travel portion configured to travel along a travel path;
a support portion configured to support a container; and
a moving mechanism configured to move the support portion along a lateral width direction which crosses the travel path as seen along a vertical direction, wherein the moving mechanism is configured to move the support portion to a projected position at which the support portion is projected along the lateral width direction with respect to the travel portion, and to a retracted position at which the support portion is closer to the travel portion than at the projected position, wherein the support portion includes a support member configured to support a bottom surface of a container from below, a movable member configured to be moved along the lateral width direction by the moving mechanism, and a vertically moving mechanism configured to move the support member along the vertical direction with respect to the movable member, wherein the container includes a main body portion which has an opening which faces a direction along the lateral width direction when the container is supported by the support portion, and a lid for closing the opening, wherein the article transport vehicle further comprises one or more fall preventing members configured to prevent a lid of a supported container which is the container that is supported by the support member from falling, and a movement coupling mechanism configured to move the one or more fall preventing members when the support member is moved, wherein each of the one or more fall preventing members is located on the opposite side of the lid of the supported container from the main body portion and is configured to be movable to a preventing position in which the fall preventing member protrudes upward with respect to a lower end of the lid, and to a retracted position in which the fall preventing member is retracted so as to be located lower than the lower end of the lid, wherein the movement coupling mechanism is configured to move the one or more fall preventing members from respective retracted positions to respective preventing positions when the support member is raised, and to move the one or more fall preventing members from respective preventing positions to respective retracted positions when the support member is lowered, wherein with the one or more fall preventing members being one or more first preventing members, and with a height of the support member at which the one or more first preventing members are in respective restricting positions being a raised height, the article transport vehicle further comprises a second preventing member configured to prevent the lid of the supported container from falling, an actuator configured to move the second preventing member, and an intermediate portion which is supported by the travel portion and supports the moving mechanism, wherein the second preventing member is supported by the intermediate portion such that the second preventing member is located on the opposite side of the lid of the supported container from the main body portion when the support portion is in the retracted position, and wherein the actuator moves the second preventing member to a restricting position at which at least a portion of the second preventing member protrudes downward with respect to an upper end of the lid when the support member is at the raised height, and to a retracted position at which the second preventing member is retracted upward with respect to the upper end of the supported container when the support member is at the raised height.

* * * * *